United States Patent
Pramanick

(10) Patent No.: US 6,465,341 B1
(45) Date of Patent: Oct. 15, 2002

(54) MANUFACTURING METHOD FOR SEMICONDUCTOR INTERCONNECT BARRIER OF BORON SILICON NITRIDE

(75) Inventor: Shekhar Pramanick, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/872,465

(22) Filed: May 31, 2001

Related U.S. Application Data

(62) Division of application No. 09/312,208, filed on May 14, 1999, now Pat. No. 6,288,448.

(51) Int. Cl.⁷ .......................................... H01L 21/4763
(52) U.S. Cl. ........................ 438/622; 438/624; 438/786
(58) Field of Search .................. 438/622, 624, 438/786; 257/758, 760

(56) References Cited

U.S. PATENT DOCUMENTS 5,817,572 A * 10/1998 Chiang et al. .............. 438/624
5,970,373 A * 10/1999 Allen .......................... 438/624

FOREIGN PATENT DOCUMENTS

| EP | 0 394 054 A1 | * | 10/1990 |
| JP | 62-156822 | * | 7/1987 |

* cited by examiner

Primary Examiner—T. N. Quach
(74) Attorney, Agent, or Firm—Mikio Ishimaru

(57) ABSTRACT

A method of manufacturing a semiconductor device includes: providing a semiconductor with a dielectric layer formed thereon; forming an opening in said dielectric layer, said opening defined by walls of said dielectric layer and exposes a portion of said semiconductor, forming a conductive layer in said opening; removing said conductive layer to said dielectric layer; and forming a barrier layer over said conductive layer and said dielectric layer, said barrier layer made of a compound of silicon nitride with a third material compounded therein wherein said third material is modulated in amount through said layer of silicon nitride.

10 Claims, 2 Drawing Sheets

MANUFACTURING METHOD FOR SEMICONDUCTOR INTERCONNECT BARRIER OF BORON SILICON NITRIDE

CROSS-REFERENCE TO RELATED APPLICATION(S)

This is a divisional of copending application Ser. No. 09/312,208 filed on May 14, 1999, now U.S. Pat. No. 6,288,448B1.

TECHNICAL FIELD

The present invention relates generally to semiconductors and more specifically to interconnect barrier materials.

BACKGROUND ART

While manufacturing integrated circuits, after the individual devices such as the transistors have been fabricated in the silicon substrate, they must be connected together to perform the desired circuit functions. This connection process is generally called "metalization", and is performed using a number of different photolithographic and deposition techniques.

In one connection process, which is called a "dual damascene" technique, two channels of conductive materials, are positioned in vertically separated planes perpendicular to each other and interconnected by a vertical "via" at their closest point.

The first channel part of the dual damascene process starts with the placement of a first channel dielectric layer, which is typically an oxide layer of silicon dioxide ($SiO_2$), over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and an thin adhesion/barrier layer is deposited to coat the walls of the first channel opening to ensure good adhesion and electrical contact of subsequent layers to the underlying semiconductor devices. The adhesion/barrier layer also improves the formation of subsequently deposited conductive material and acts as an adhesion/barrier material to prevent diffusion of such conductive material into the oxide layer and the semiconductor devices. A seed layer is then deposited on the adhesion/barrier material to act as the conductive material base, or "seed", for subsequent conductive metal deposition. A first conductive material is then deposited on the seed layer and subjected to a chemical-mechanical polishing process which removes the various materials above the first channel oxide layer and damascenes the first conductive material in the first channel openings to form the first channels.

The via formation step of the dual damascene process starts with the deposition of a thin capping stop nitride layer of silicon nitride (SiN) over the first channels and the first channel oxide layer. The thin nitride layer acts to prevent diffusion of conductive material between channels. Subsequently, a separating oxide layer is deposited on the nitride layer. This is followed by deposition of a thin via nitride layer. Then a via step photoresist is used in a photolithographic process to designate round via areas over the first channels.

A nitride layer etch is then used to etch out the round via areas in the via nitride layer. The via step photoresist is then removed, or stripped. A second channel dielectric layer, which is typically an oxide layer of silicon dioxide, is then deposited over the via nitride layer and the exposed oxide in the via area of the via nitride layer. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride layer etch process removes the nitride layer above the first channels in the via areas. An adhesion/barrier layer is then deposited to coat the via openings and the second channel openings. This is followed by a deposition of the second conductive material in the second channel openings and the via openings to form the second channel and the via. A second chemical-mechanical polishing process leaves the two vertically separated, horizontally perpendicular channels connected by cylindrical vias.

A subsequent nitride layer is then deposited as a capping layer or in preparation of multiple layers of channels.

The use of the dual damascene technique eliminates metal etch and dielectric gap fill steps typically used in the metalization process. The elimination of metal etch steps is important as the semiconductor industry moves from aluminum to other metalization materials, such as copper, which are very difficult to etch.

One drawback of using copper is that copper diffuses rapidly through various materials. Unlike aluminum, copper also diffuses through dielectrics, such as oxides. When copper diffuses through dielectrics, it can cause damage to neighboring devices on the semiconductor substrate. To prevent diffusion, materials such as tantalum nitride (TaN), titanium nitride (TiN), or tungsten nitride (WN) are used as channel adhesion/barrier materials for copper.

For capping barriers between conductive channels, the preferred barrier material has been silicon nitride since it is a good barrier material. However, it has a high dielectric constant which means it tends to increase capacitance between channels and thus reduce semiconductor circuit speed.

However, even with the various types of barrier layers, copper is still subject to strong electro-migration, or movement of copper atoms under current which can lead to voids in the copper channels and vias. Copper also has poor surface adhesion. A solution, which would form a better capping material with better surface adhesion, which would mean less electro-migration, and with a lower dielectric constant, has been long sought. As the semiconductor industry is moving from aluminum to copper and other type of materials in order to obtain higher semiconductor circuit speeds, it is becoming more pressing that a solution be found.

DISCLOSURE OF THE INVENTION

The present invention provides a semiconductor interconnect barrier material having a lower dielectric constant, lower diffusion barrier characteristics, lower surface diffusion characteristics, and adhesion better than plain silicon nitride.

The present invention further provides a semiconductor interconnect barrier material of boron silicon nitride having a lower dielectric constant, lower diffusion barrier characteristics, lower surface diffusion characteristics, and improved adhesion over conventional, plain silicon nitride.

The present invention further provides a semiconductor interconnect barrier material of boron silicon nitride having a lower dielectric constant, lower diffusion barrier characteristics, lower surface diffusion characteristics, and improved adhesion over conventional silicon nitride by modulating the boron to be boron rich near the conductive material.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
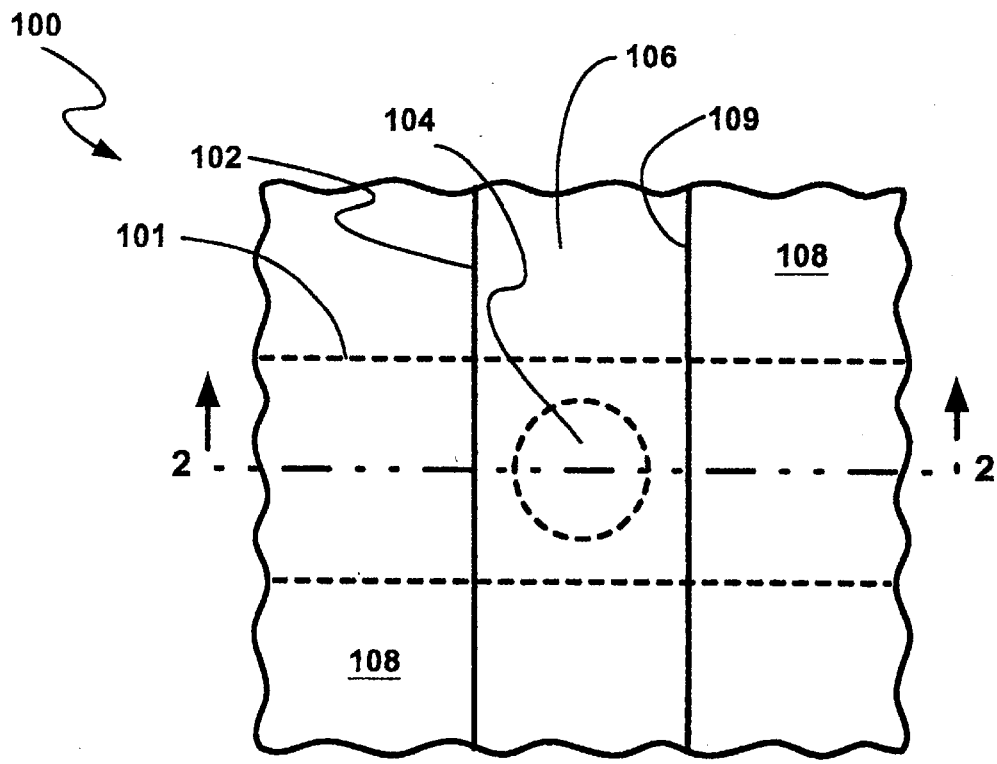
FIG. 1 (PRIOR ART) is a plan view of aligned channels with a prior art via.

Referring now to FIG. 1 (PRIOR ART), therein is shown a plan view of a prior art pair of aligned semiconductor channels of a conductive material such as aluminum, copper, tungsten or polysilicon disposed over a production semiconductor wafer 100. A first channel 101 is shown disposed below a second channel 102 which extends substantially perpendicular to the first channel 101 in the plan view. Similarly, a round via 104 connects the first and second channels 101 and 102 and is a part of the second channel 102. The first channel 101 comprises a first conductive material. The second channel 102 is formed by filling a second channel opening 106 disposed in a second channel oxide layer 108 with a second conductive material. The second channel opening 106 is defined by sidewalls 109 of second channel oxide layer 108.

Figure 2:
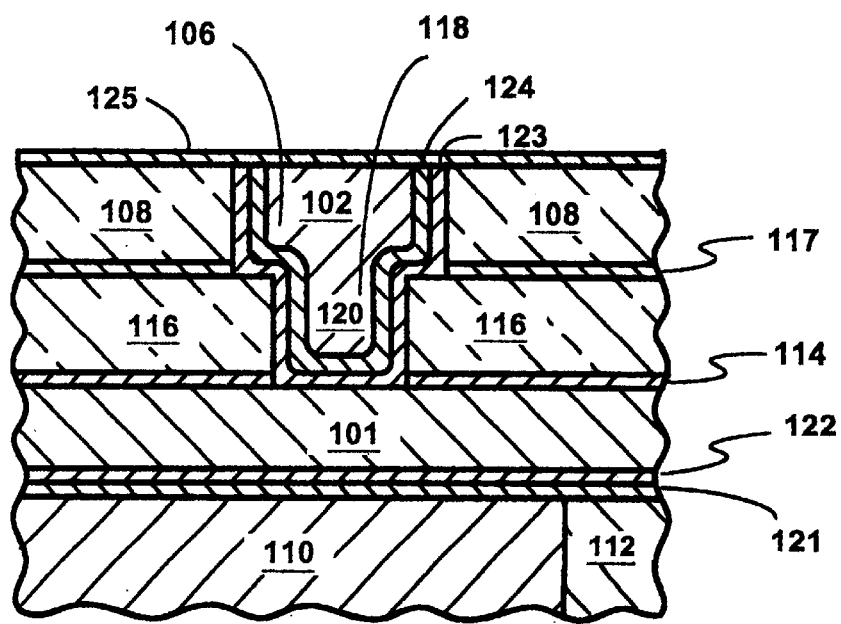
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along 2—2. The first channel 101 is disposed over a polysilicon gate 110 and a dielectric 112 of a semiconductor device on an integrated circuit chip (not shown). The first and second channels 101 and 102 are in horizontal planes separated vertically by a stop nitride layer 114, a via oxide layer 116, and a thin via nitride layer 117. The conventional nitride layer is composed of a compound of silicon nitride. The cross-sectional area of the round via 104 of FIG. 1 (PRIOR ART) defines a cylindrical via opening 118 which becomes cylindrical via 120 when it is filled with the second conductive material. Also shown disposed around the first channel 101 is an adhesion/barrier layer 121 and a seed layer 122, and around the second channel 102 and the cylindrical via 120 is an adhesion/barrier layer 123 and a seed layer 124. A nitride layer 125 caps the second channel 102 and the second channel oxide layer 108.

Figure 3:
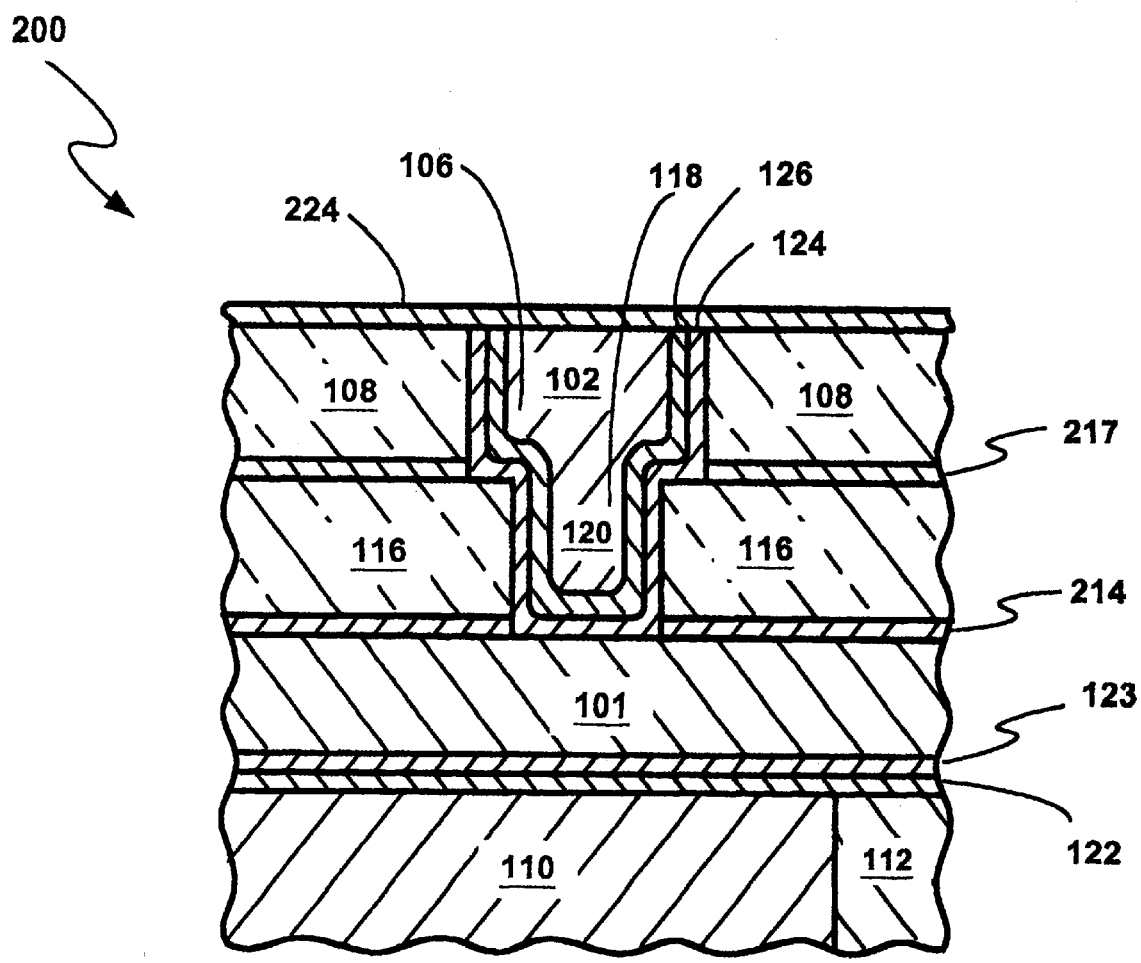
FIG. 3 is a simplified cross-section of a partially processed semiconductor wafer after depositing the capping barrier on the conductive material.

Referring now to FIG. 3, therein is shown the cross-section of a semiconductor wafer 200 in a preliminary stage of manufacture. Strictly for ease of understanding, the completed semiconductor wafer 200 can be understood to be the equivalent of the semiconductor wafer 100 taken along the line 2—2. Thus, the cross-section of FIG. 3 shows the cross-section of semiconductor wafer 200 after the deposition of the adhesion/barrier layer 121, the seed layer 122, and the first channel 101. The seed layer 122 would also be formed of adhesion/barrier materials such as Ta/TaN, Ti/TiN, WN/WN, and the first channel 101 would be formed of copper or a copper alloy. The surface of the first channel 101, as shown, has been chemical-mechanical polished to be level with the first channel dielectric layer (not shown) and a stop nitride layer 214 deposited on the finished surface. The stop nitride layer 214 is a boron silicon nitride (BSiN). Similarly, therein are shown a nitride layer 217 and the capping nitride layer 125, which are both also of boron silicon nitride.

In production in the past, a conventional first damascene process was used to put down over a production semiconductor wafer 100 a first channel 101 in a first channel oxide layer (not shown) above portions of a semiconductor device (not shown). The damascene process is a photolithographic process which uses a mask to define a first channel opening (not shown) in the first channel oxide layer. The first channel opening is then filled with the thin adhesion/barrier layer 121, the thin seed layer 122, and the first conductive material, such as copper, to form the first channel 101 using conventional a metal deposition technique, such as physical vapor deposition, chemical vapor deposition, electroplating, or a combination thereof. The top surface would then be subject to chemical-mechanical polishing (CMP).

For the second channel 102, the stop nitride layer 114, the via oxide layer 116, and the via nitride layer 117 would be successively deposited on top of the first channel 101 and the first channel oxide layer using conventional deposition techniques.

By using the via photoresist and the via photolithographic process followed by nitride etching of a round via opening 104 in the via nitride layer 117, the basis for the cylindrical via opening 118 was formed. The subsequent deposition of the second channel oxide layer 108 prepared the way for the second channel 102 to be perpendicular to the first channel 101.

The second damascene process is a photolithographic process which uses a mask to define the second channel opening 106 in the second channel oxide layer 108. Since the second damascene process uses an anisotropic oxide etch, the etch also forms the cylindrical via opening 118 down to the stop nitride layer 114. The anisotropic oxide etch etches faster in the vertical direction of FIG. 3 than in the horizontal direction. The nitride etch of the stop nitride layer 114 exposes a portion of the first channel 201 and completes the etching steps. The second channel opening 106 is then filled with the thin adhesion/barrier layer 123, the thin seed layer 124, and the second conductive material. The second conductive material is also a conductor, such as copper, to form the second channel 102 using conventional metal deposition techniques, such as physical vapor deposition, chemical vapor deposition, electroplating, or a combination thereof. A CMP process is used to level the second channel 102 to form the structure shown in FIG. 2.

Next, the second conductive material is deposited into second channel opening 106 and via opening 118 using conventional metal deposition techniques, such as physical vapor deposition, chemical vapor deposition, electroplating, or a combination thereof. Thereafter, a chemical-mechanical polishing process is used to complete the conventional process.

In production with the present invention, said steps are the same through the first damascene process of filling the first channel opening with the thin adhesion/barrier layer 121, the thin seed layer 122, and the first conductive material. At this point, the CMP would be used to remove the first conductive material down to the via oxide layer 116.

A conventional process, such as chemical vapor deposition, is then used to deposit the stop nitride layer 214 of boron silicon nitride by reacting silane ($SiH_4$) in an ammonia ($NH_3$) atmosphere in the presence of a boron (B) based diborine gas. The boron silicon nitride has a lower dielectric constant than silicon nitride while acting as an equally good diffusion barrier.

The amount of boron in the compound can also be controlled so as to make the boron silicon nitride compound more boron rich near the conductive material of copper or copper alloy. This leads to the formation of copper boride at the interface which means that the adhesion is greatly improved and that surface diffusion will be greatly decreased and electro-migration lifetime extended.

With the stop nitride layer 214 in place, the second damascene process is performed. The etch of the nitride layer 217 and stop nitride layer 214 will be performed to provide the opening for the conductive seed layer 124. Subsequently, the damascene semiconductor wafer processing, including the deposition of the capping nitride, can be repeated for additional levels of channels. The capping layer 224 of boron silicon nitride is shown above the second channel 102 and the second channel oxide layer 108.

While the best mode utilizes copper as the conductive material, it should be understood that the present invention is applicable to conductive materials such as copper, aluminum, doped polysilicon, gold, silver, compounds thereof, alloys thereof, and combinations thereof.

Further, although the embodiments of the present invention are directed to using the dual damascene technique, it also will be recognized by those skilled in the art that other techniques of forming interconnect, such as the single damascene technique, or other traditional techniques of forming low resistance contacts or plugs which involve filling an opening with conductive materials such as tungsten or aluminum may be used to practice the present invention.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing a semiconductor device, comprising:

providing a semiconductor with a dielectric layer formed thereon;

forming an opening in said dielectric layer, said opening defined by walls of said dielectric layer and exposes a portion of said seniconductor;

forming a conductive layer in said opening;

removing said conductive layer to said dielectric layer; and forming a barrier layer over said conductive layer and said dielectric layer, said barrier layer made of a compound of silicon nitride with a third material compounded therein wherein said third material is modulated in amount through said layer of silicon nitride.

2. The method as claimed in claim 1 wherein forming said barrier layer modulates the amount of said third element to provide increased amounts proximate said conductive layer than distal therefrom.

3. The method as claimed in claim 1 including:

modulating the amount of said third element to provide increased amounts proximate said conductive layer than distal therefrom.

forming a second dielectric layer over said barrier layer;

forming an opening in said second dielectric layer, said opening defined by walls of said dielectric layer and exposes a portion of said barrier layer with increased amounts of said third element;

forming a second conductive layer over said barrier layer and in said opening, said second conductive layer bonding with said third element;

removing said conductive layer to said second dielectric layer; and forming a second barrier layer over said conductive layer and said dielectric layer, said second barrier layer made of a compound of silicon nitride with a third element.

4. The method as claimed in claim 1 wherein forming said barrier layer involves reacting silane in ammonia in the presence of diborine gas.

5. The method as claimed in claim 1 wherein forming said barrier layer uses boron as said third element.

6. The method as claimed in claim 1 wherein forming said conductive material uses a material selected from a group comprising copper, aluminum, doped polysilicon, gold, silver, compounds thereof, alloys thereof, and a combination thereof.

7. A method of manufacturing a semiconductor device, comprising:

providing a semiconductor wafer with a dielectric layer formed thereon;

forming an opening in said dielectric layer, said opening defined by walls of said dielectric layer and exposes a portion of said region on said semiconductor wafer;

forming a conductive layer in said opening, said conductive layer of a material selected from a group comprising copper, compounds thereof, alloys thereof, and combinations thereof;

removing said conductive layer to said dielectric layer; and forming a barrier layer over said conductive layer and said dielectric layer, said barrier layer made of a silicon nitride with boron therein wherein said boron is modulated in amount through said layer of silicon nitride.

8. The method as claimed in claim 7 wherein forming said barrier layer modulates the amount of said boron through said layer of silicon nitride.

9. The method as claimed in claim 8 wherein forming said barrier layer modulates the amount of said boron to provide increased amounts proximate said conductive layer than distal therefrom.

10. The method as claimed in claim 8 including:

modulating the amount of said boron to provide increased amounts proximate said conductive layer than distal therefrom, forming a second dielectric layer over said barrier layer;

forming an opening in said second dielectric layer, said opening defined by walls of said dielectric layer and exposes a portion of said barrier layer with increased amounts of said boron;

forming a second conductive layer over said barrier layer and in said opening, said second conductive layer bonding with said boron;

removing said conductive layer to said second dielectric layer; and forming a second barrier layer over said conductive layer and said dielectric layer, said second barrier layer made of a compound of silicon nitride with boron.

* * * * *